United States Patent [19]

Mikkor

[11] Patent Number: 4,773,972
[45] Date of Patent: Sep. 27, 1988

[54] METHOD OF MAKING SILICON CAPACITIVE PRESSURE SENSOR WITH GLASS LAYER BETWEEN SILICON WAFERS

[75] Inventor: Mati Mikkor, Ann Arbor, Mich.

[73] Assignee: Ford Motor Company, Dearborn, Mich.

[21] Appl. No.: 924,720

[22] Filed: Oct. 30, 1986

[51] Int. Cl.[4] .............................................. G01L 9/12
[52] U.S. Cl. ........................................ 204/16; 73/718; 73/724; 29/621.1; 437/901; 437/921; 361/283; 148/DIG. 12
[58] Field of Search .................. 156/89; 361/280, 283; 73/718, 724; 29/590, 29.42, 610, 5 G; 437/14, 901, 921, 203, 954; 204/16; 148/DIG. 12

[56] References Cited

U.S. PATENT DOCUMENTS

| | | | |
|---|---|---|---|
| 3,372,070 | 3/1968 | Zuk | 437/203 X |
| 3,397,278 | 8/1968 | Pomerantz | 29/577 |
| 3,589,965 | 6/1971 | Wallis et al. | 204/16 X |
| 3,979,820 | 9/1976 | Anthony et al. | 437/954 X |
| 4,177,496 | 12/1979 | Bell et al. | |
| 4,184,189 | 1/1980 | Davis et al. | |
| 4,207,604 | 6/1980 | Bell | |
| 4,261,086 | 4/1981 | Giachino et al. | |
| 4,345,299 | 8/1982 | Ho | |
| 4,386,453 | 6/1983 | Giachino et al. | |
| 4,390,925 | 6/1983 | Freud | |
| 4,415,948 | 11/1983 | Grantham et al. | |
| 4,420,790 | 12/1983 | Golke et al. | |
| 4,424,713 | 1/1984 | Kroninger, Jr. et al. | |
| 4,586,109 | 4/1986 | Peters et al. | 361/283 |
| 4,609,966 | 9/1986 | Kuisma | 73/724 X |
| 4,625,561 | 12/1986 | Mikkor | 361/283 X |

FOREIGN PATENT DOCUMENTS 0825770 12/1959 United Kingdom ................. 29/590

Primary Examiner—Michael W. Ball
Assistant Examiner—Jeff H. Aftergut
Attorney, Agent, or Firm—Peter Abolins; Keith L. Zerschling

[57] ABSTRACT

A method of bonding two silicon wafers each having a capacitive plate. Two highly-doped electrically semiconductive feedthrough paths are formed through one wafer, each path contacting one of the capacitive plates. A glass layer is formed on one of the silicon wafers where bonding is desired between the two wafers. The glass layer is anodically bonded to the other of the silicon layers.

10 Claims, 2 Drawing Sheets

METHOD OF MAKING SILICON CAPACITIVE PRESSURE SENSOR WITH GLASS LAYER BETWEEN SILICON WAFERS

BACKGROUND OF THE INVENTION

1. Field of the Invention

This invention relates to a method for manufacturing variable capacitance pressure transducers wherein two silicon wafers are anodically bonded with a thin intervening glass layer.

2. Prior Art

U.S. Pat. No. 4,415,948 teaches bonding of two highly doped silicon wafers, one with an etched cavity, together by using an intermediary glass coating deposited on one wafer. The other wafer is sealed to the coated wafer by electrostatic bonding. In this device, the silicon itself acts as an electrical conductor and no feedthroughs are used. This patent neither teaches nor suggests the special fabrication features which can be advantageously used when lightly doped silicon wafers are used and when contact to metalized electrodes on the inner surfaces of an enclosed cavity between the silicon wafers is made by a highly conductive path in the lightly doped silicon.

U.S. Pat. No. 4,420,790 teaches forming a cavity by putting silicon spacers between two silicon plates that are covered with passivation layers of silicon dioxide and by a combination of silicon dioxide and silicon nitride layers. These layers electrically isolate the capacitor electrodes. The sensor cavity is not hermetically sealed but is open to the ambient. The two silicon plates are joined together by solder bumps and the spacing between the plates is kept constant by the spacers.

U.S. Pat. No. 4,424,713 teaches making a sensor structure including plates of glass, silicon and glass. The silicon is sealed to the glass by electrostatic bonding. The silicon plate has cavities on both sides, the cavity on one side being bigger than on the other side in order to provide stress relief on the silicon diaphragm. The teachings of this patent include relieving stresses at the glass silicon interface where the silicon diaphragm of a pressure sensor is bonded to glass plate by anodic bonding on both its front and back surfaces. Contact to electrodes on plate glass is made by metalized holes in the glass plate.

U.S. Pat. No. 4,390,925 teaches making a sensor with multiple interconnected cavities in a silicon plate bonded electrostatically to a glass plate. Such a structure is taught to be a high pressure sensor.

U.S. Pat. No. 4,184,189 teaches making a sensor with two metalized glass plates bonded together by a sealing glass mixture at about 500° C. The spacing between plates is achieved by shim stock, such as a glass sealing spacer ring.

U.S. Pat. No. 4,207,604 teaches making a pressure sensor with a pair of insulating metalized plates sealed by melting glass frit. A metalized guard ring for the capacitor is used.

U.S. Pat. No. 4,345,299 teaches using two metalized ceramic substrates with an annular sealing ring to form a capacitive pressure transducer.

U.S. Pat. No. 4,177,496 teaches metalizing a pair of thin insulating plates (alumina quarts, Pyrex) to form a capacitor. Glass frit or ceramic base material is fired to form a seal.

U.S. Pat. No. 4,261,086 teaches making a sensor by using a silicon wafer with etched cavities and anodically bonding it to a relatively thick glass substrate, for example, 1 mm to 2 mm. The capacitor electrodes are formed by metalizing the glass and highly doping the silicon cavity surface. Electrical connections are made through metalized holes in the glass.

U.S. Pat. No. 4,386,453 teaches making a sensor by using a silicon wafer with etched cavities anodically bonded to a glass substrate. There is metallization of holes drilled in the glass. The metalized holes are used as electrical feedthroughs to make contact to capacitor plates.

Even though there are known capacitive-type pressure sensors, there continues to be a need to have a pressure sensor which has improved reliability in maintaining the hermetic seal of the sensing cavity and is not adversely effected by thermocycling. These are some of the problems this invention overcomes.

SUMMARY OF THE INVENTION

This invention includes a bonding technique of a silicon wafer with a cavity to a silicon substrate via a pyrex glass layer using anodic bonding to form a capacitive pressure sensor with electrical feedthroughs of highly doped p+ paths in a n-type silicon. When one capacitor electrode is a highly doped silicon surface, then a sandwich of Pyrex/metal/Pyrex layers is used at bonding areas. When both electrodes are insulated from the silicon substrates by dielectric layers, a direct silicon/Pyrex bond can be formed. The electrical connections to the capacitor electrodes are made by highly doped p+ paths in lightly doped n-type silicon. The n-type silicon can be reverse biased with respect to p+ regions which increases the impedance of the p-n junction isolation between the feedthroughs.

This is an improvement over a silicon capacitive pressure sensor wherein a silicon wafer with an etched cavity is anodically bonded to a thick (1 to 2 mm) Pyrex glass substrate. In the present sensor, the thermal mismatch in coefficient of expansion is limited to the thin (5 to 10 $\mu$m) Pyrex glass layer joining the two silicon pieces. This greatly reduces the stresses on the sensor pieces during thermal cycling. Secondly, the electrical connections to the capacitor electrodes are made by highly doped p+ paths in the lightly doped n-type silicon. Since the connecting paths are an integral part of silicon, no sealing problems are encountered with the electrical feedthroughs that could affect the hermetically of the sensing cavity.

DETAILED DESCRIPTION OF THE INVENTION

Figure 1:
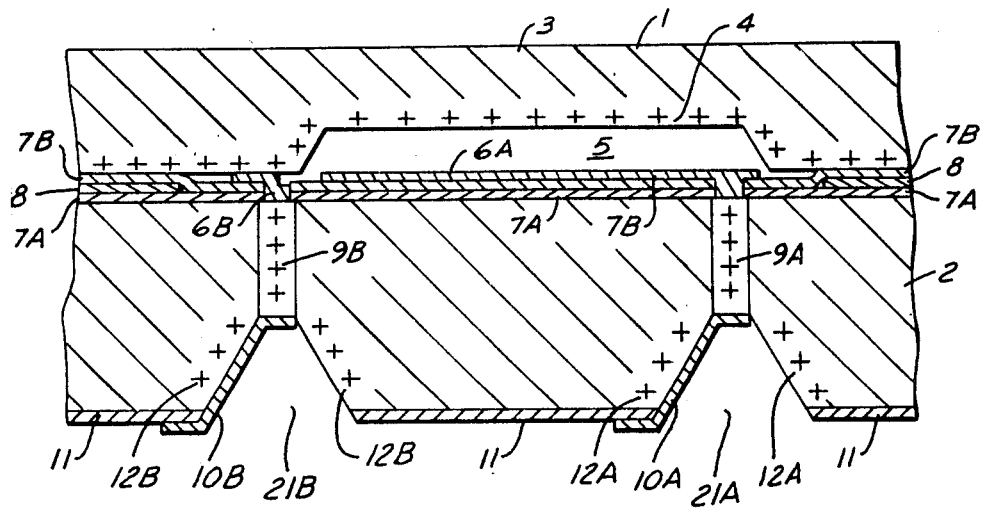
FIG. 1 is a cross section view of a sensor in accordance with the first embodiment of this invention wherein anodic bonding is done using an electrically isolated metal layer.

Referring to FIG. 1, a pressure sensor 50 includes a silicon wafer 1 which is lightly doped with an n-type impurity and has an etched cavity 5. A silicon substrate wafer 2 is also lightly doped with a n-type impurity. A portion of silicon wafer 1 acts as a diaphragm 3 because of its relatively reduced thickness adjacent a cavity 5. A highly boron doped, p+, surface 4 of silicon wafer 1 acts as a capacitor electrode.

Conductive paths 9A and 9B through silicon substrate 2 are formed of highly aluminum doped p+ regions and make contact with surface electrode 4 and a metallic chromium-gold electrode 6A, respectively, formed adjacent silicon substrate wafer 2 in the region of cavity 5. More particularly, a Pyrex glass layer 7A, or equivalent glass having sodium ions and a coefficient of thermal expansion close to that of silicon, is deposited on silicon substrate wafer 2. A metal layer 8, such as chromium or nickel, is deposited on portions of pyrex layer 7A in the anodic bonding areas surrounding cavity 5. Metal layer 8 is used to bias pyrex layer 7B during the anodic bonding. A Pyrex glass layer 7B is formed on metal layer 8 and on other exposed regions of Pyrex glass layer 7A. Metal electrode 6A is formed on the exposed region of conductive paths 9A and extends over pyrex glass layer 7B in the region of cavity 5. Metal pad 6B is formed on substrate wafer 2 in the region of the exposed portion of highly doped conductive path 9B and extends over a portion of Pyrex glass layer 7B. Electrode 6B is not aligned with cavity 5 and touches the highly doped surface electrode 4 of silicon wafer 1. When wafer 1 and silicon substrate 2 are joined to each other, heated and subjected to an electric voltage, anodic bonding occurs in the region of metal layer 8.

On the bottom side surface of silicon substrate wafer 2, opposite from the surface of silicon substrate 2 facing toward cavity 5, are feedthrough wells 21A and 21B which are indentations formed into silicon substrate 2 at locations aligned with conductive paths 9A and 9B, respectively. Highly doped p+ conductive surface regions 12A and 12B are formed into the side walls of feedthrough wells 21A and 21B, respectively. The use of the feedthrough wells 21A and 21B permits a shorter highly doped p+ paths 9A and 9B. Metal contact pads 10A and 10B formed in feedthrough wells 21A and 21B, respectively, contact one end of conductive paths 9A and 9B, respectively, and extend over a portion of the bottom surface of silicon substrate wafer 2. A silicon dioxide layer 11 covers the bottom surface of silicon substrate wafer 2 in all the regions except those at feedthrough wells 21A and 21B. The highly doped boron p+ surface layer 12 on the feedthrough walls provides p-n junction isolation between silicon substrate wafer 2 and metal contact pads 10.

The process of anodic bonding silicon substrate wafer 2 to silicon wafer 1 includes depositing pyrex layer 7A on silicon wafer 2 by sputtering to a thickness of about 3-5 $\mu$m. This process bonds layer 7A to silicon wafer 2. Then metal film 8, for instance chromium or nickel, is evaporated on pyrex layer 7A in the areas where the bonding occurs. Then another Pyrex layer 7B is deposited on top of the metal film 8. During anodic bonding of silicon wafer 1 to pyrex layer 7B, a negative potential of about a few hundred volts is applied (such that an electric field across Pyrex layer 7B is less than the breakdown field) to metal film 8 and positive potential to silicon wafer 1. This is done at temperatures of 400°-500° C. At these temperatures the sodium ions in pyrex layer 7B are mobile and move away from the silicon wafer/pyrex-layer 7B interface allowing bonding between glass layer 7B and silicon wafer 1 to occur.

At about 400°-500° C., wafers 1 and 2 are electrically shorted by thermal generation of intrinsic carries by contact 6B from substrate wafer 2 to wafer 1. The n-p junction isolation becomes ineffective at these temperatures. Thus, one cannot bias Pyrex film 7B by applying negative potential to substrate wafer 2 and positive potential to wafer 1. To overcome this, Pyrex film 7B has to be biased by metal layer 8 that is electrically isolated from both silicon wafers 1 and 2.

The following is a summary of processing steps in the anodic bonding of silicon wafer 2 to silicon wafer 1:

(1) The silicon wafers 1 and 2, lightly doped with n-type material, are oxidized or coated with silicon nitride.

(2) The oxide on wafer 1 is patterned using photolithography techniques. Oxide at the cavity location is removed by etching in buffered HF. Then a cavity is etched into the silicon using an anisotrophic etch. e.g. KOH/H$_2$O solution. A double-sided etching of the silicon wafer may be necessary to obtain proper thickness of diaphragm 3.

(3) The remaining oxide is stripped away from both sides of the wafer 1 and the whole surface on cavity side is highly doped by boron to form a highly conductive p+ layer 4. This layer forms one of the electrodes of the capacitor and is also used to make contact to the feedthrough 9 via contact pad 6B.

Processing continues with additional steps for silicon substrate wafer 2:

(4) The oxide 11 on wafer 2 is patterened and removed at locations for feedthroughs 9 as in step 2. Deep access holes are etched into silicon at these locations to decrease the migration distance of Al/Si eutectic droplets that are used to form the feedthroughs 9.

(5) Aluminum dots, 2-3$\mu$ thick are evaporated through a shadow mask into the bottom of the access holes. The wafer is then put into a thermal gradient furnace in an inert atmosphere like argon, where the thermal gradient is perpendicular to wafer, 200° C./cm, at 1200° C. The aluminum/silicon eutectic droplet that is formed is migrated through the wafer in direction of the thermal gradient leaving behind highly p+ doped paths 9 which act as electrical feedthroughs to make contact to the electrodes 4 and 6A.

(6) Access wall surfaces 12A and 12B are doped with boron or aluminum making these regions p+. This will allow p-n junction isolation of metal contacts 10A and 10B from the n-type silicon substrate wafer 2 and thus increases the impedance between the two electrode feedthroughs 9-10.

(7) Oxide on the cavity side of wafer 2 is removed and first pyrex layer 7A about 3-5 $\mu$m thick is deposited on the wafer, for example, by sputtering. Then a metal bonding ring 8, for example, chromium or nickel is deposited, through a shadow mask by electron beam evaporation. This square ring of metal will surround the cavity and forms the bond area between wafers 1 and 2. Next, a second layer of Pyrex 7B is deposited. Photolithography and etching techniques are used to remove the pyrex at the feedthrough location 9.

(8) Next chrominum/gold electrode contact pad 6A and contact pad 6B is deposited on Pyrex lyaer 7B. This can be done by evaporation through a shadow mask in a vacuum system.

(9) The anodic bonding of the wafers is done as follows: The two wafers 1 and 2 are now aligned and brought together in a vacuum, heated to 400° C., and a negative potential of a few hundred volts (below breakdown electric field of Pyrex) is applied to metal layer 8 with respect to wafer 1 (at positive potential). This process will form an hermetic seal between the silicon wafer 1 and the Pyrex layer 7B. The adhesion of sputtered pyrex layer 7A to wafer 2 can also be reinforced by applying negative voltage to metal 8 and positive voltage to wafer 2.

(10) Metal contacts 10 to the feedthrough on back side of wafer 2 are evaporated or sputtered through a shadow mask.

Figure 2:
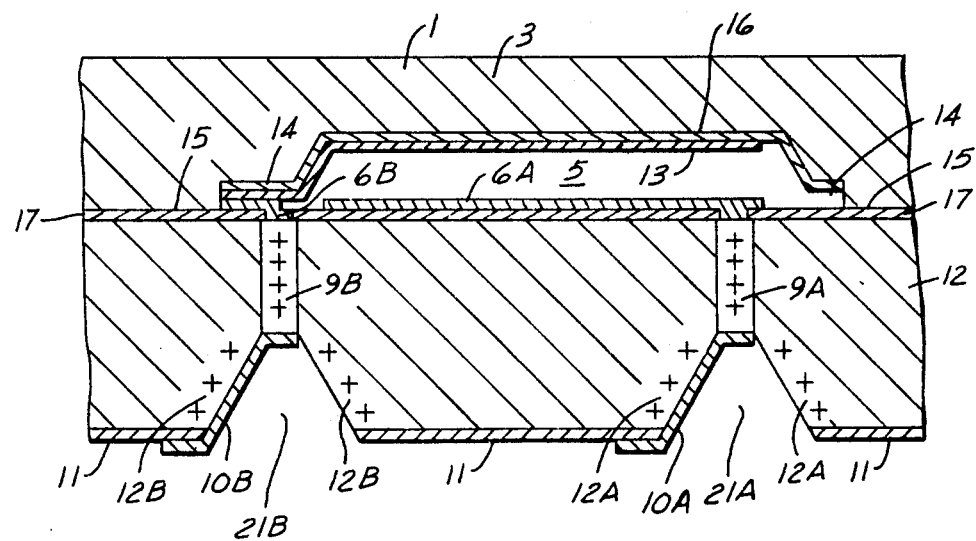
FIG. 2 is a cross section view of a sensor in accordance with a second embodiment of this invention wherein anodic bonding is done using two electrically isolated silicon wafers.

Referring to FIG. 2, numbering on FIG. 2 indicates the same type of element as in FIG. 1. A single pyrex layer 17 is deposited on wafer 2. A silicon dioxide layer 16 is grown on wafer 1 adjacent cavity 4. A metal electrode 13, such as chromium or gold vapor, is deposited on layer 16. The silicon on wafer 1 is etched back to accommodate insulating layer 16 such that there is only a negligible step between layer 16 and the silicon in a bonding area 15.

Referring to FIG. 2, in capacitive pressure sensor 60 metal electrode 13 is electrically isolated from wafer 1 by silicon dioxide layer 16. This is advantageous because at anodic bonding temperatures 400° C. when the p-n junction isolation between feedthrough 9 becomes ineffective, the silicon wafer 1 is still insulated electrically from silicon wafer 2 by the pyrex layer 17. There is no electrical path via silicon/metal interconnects between wafer 1 and wafer 2. This fact allows the anodic bonding between Pyrex layer 17 and silicon wafer 1 to take place by biasing wafer 1 positively and wafer 2 negatively. The latter negative bias also biases the Pyrex layer negatively in the bond area.

The other difference from sensor shown in FIG. 1 is that the silicon wafer around the edge of cavity at location 14 is slightly "etched back". This is done to insure that the silicon dioxide layer 16, sputtered or grown on wafer 1, matches or is slightly below the silicon surface 15 in the bond area. This allows the silicon surface of wafer 1 to come into direct contact with pyrex layer 7 on wafer 2.

Electric contact to upper electrode 13 is made by metal contact 6B and the highly doped p+ feedthrough 9. The electrical feedthroughs 9 are isolated from each other by p-n junction isolation, same as shown in Case 1. The isolation can be enhanced by back biasing wafer 2 with respect to the feedthroughs. The rest of the processing steps are similar to the method described in connection with FIG. 1.

Figure 3:
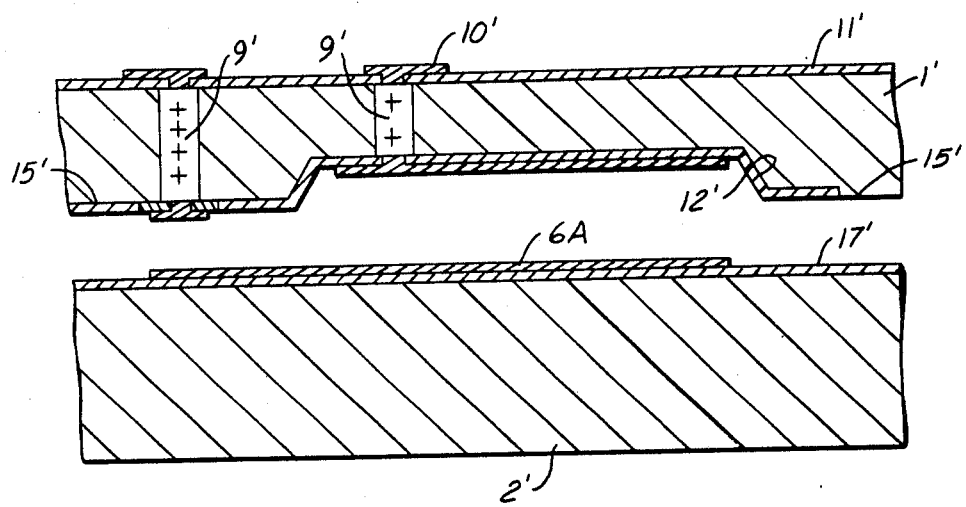
FIG. 3 is a variation of the embodiment of FIG. 2 wherein electrical feedthrough connections are made through the wafer with a cavity.

FIG. 3 is a pressure sensor analogous to the configuration shown in FIG. 2. Corresponding parts have the same identifying number with the addition of a prime ('). The sensor of FIG. 3 differs from the sensor of FIG. 2 in that electrical connections to the electrodes in FIG. 3 are made through the wafer with the cavity. In FIG. 2 electrical connections are made through the wafer without the cavity.

Various modifications and variations will no doubt occur to those skilled in the arts to which this invention pertains. For example, the particular shape of the cavity for the pressure sensor may be varied from that disclosed herein. These and all other variations which basically rely on the teachings through which this disclosure has advanced the art are properly considered within the scope of this invention.

I claim:

1. A method bonding two silicon wafers to form a capacitive pressure sensor including the steps of:
    forming a first silicon wafer,
    forming a second silicon wafer,
    forming a first capacitive electrode on said first silicon wafer;
    forming a second capacitive electrode on said second silicon wafer;
    forming a first and second highly doped electrically semiconductive feedthrough path through the second silicon wafer, so that the first path can be used to contact the first capacitive electrode and the second path can be used to contact the second capacitive electrode;
    forming a first glass layer, with sodium ions and coefficient of thermal expansion close to that of silicon, on the first silicon wafer;
    forming a metal layer on a region of the first glass layer;
    forming a second glass layer on the metal layer and on a region of the first glass layer devoid of said metal layer; and
    anodically bonding the first and second glass layers respectively to the first and second silicon wafers in the region of the metal layer and anodically bonding the first and second silicon wafers to each other in the region devoid of said metal layer, wherein the step of anodically bonding includes applying a voltage between the metal layer and the silicon wafers to be anodically bonded to the glass layers, and wherein forming the first and second silicon wafers includes lightly doping the first and second silicon wafers with an n-type carrier.

2. A method of bonding two silicon wafers as recited in claim 1 wherein:
    forming the first capacitive electrode including forming a diaphragm with a highly doped p+ type conductive region on the side of the first silicon wafer facing the second silicon wafer; and
    forming the second capacitive electrode includes forming a metallization on the second silicon wafer facing the diaphragm of the first wafer.

3. A method bonding two silicon wafers as recited in claim 2 wherein the step of forming the first and second feedthrough paths includes aligning the first feedthrough path with the first capacitive electrode in a spaced relationship to the second capacitive electrode and aligning the second feedthrough path with the second capacitive path.

4. A method of bonding two silicon wafers as recited in claim 5 wherein the stop of forming the first and second paths includes the steps of:
    forming a recessed feedthrough well at the location of each path thereby reducing the thickness of the second silicon wafer at the location of the path;
    forming a highly doped p+ conductive region on the surface of the feedthrough well; and
    forming a metal conductive path along the surface of the feedthrough well.

5. A method of bonding two silicon wafers as recited in claim 4 further comprising the step of forming a metal contact pad on the side of the second silicon wafer facing the first silicon wafer at the location of the first conductive path.

6. A method of bonding two silicon wafers as recited in claim 1 wherein the step of forming the first capacitive electrode includes:
    forming a cavity in the first silicon wafer thereby defining a diaphragm for the capacitive pressure sensor;

forming a silicon dioixde layer on the side of the diaphragm facing the second silicon wafer; and forming a first metallization on the silicon dioxide layer.

7. A method of bonding two silicon wafers as recited in claim 6 wherein said step of anodically bonding includes applying a voltage between the first silicon wafer and the second silicon wafer.

8. A method of bonding two silicon wafers as recited in claim 7 further comprising the step of etching the surface of the first silicon wafer adjacent the periphery of the silicon dioxide layer so as to form a relatively even surface to improve the fit and coupling between the first and second silicon wafers.

9. A method of bonding two silicon wafers as recited in claim 1 wherein the step of forming the first capacitive electrode includes forming a first metallization on the glass layer; and the step of forming the second capacitive electrode includes:

forming a cavity in the second silicon wafer thereby defining a diaphragm for the capacitive pressure sensor;

forming a silicon dioxide layer on the side of the diaphragm facing the first silicon wafer; and forming a second metallization on the silicon dioxide layer.

10. A method of bonding two silicon wafers as recited in claim 7 further comprising the step of etching the surface of the second silicon wafer adjacent the periphery of the silicon dioxide layer so as to form a relatively even surface to improve the fit and coupling between the first and second silicon wafers.

* * * * *